(12) United States Patent
Bai et al.

(10) Patent No.: US 6,900,429 B1
(45) Date of Patent: May 31, 2005

(54) IMAGE CAPTURE DEVICE

(75) Inventors: Jin-Chung Bai, Taipei (TW);
Kuang-Pao Cheng, Hsinchu (TW);
Chi-Pang Huang, Taoyuan (TW)

(73) Assignee: Stack Devices Corp., Miaoli (TW)

( * ) Notice: Subject to any disclaimer, the term of this patent is extended or adjusted under 35 U.S.C. 154(b) by 0 days.

(21) Appl. No.: 10/806,165

(22) Filed: Mar. 23, 2004

(51) Int. Cl.⁷ .............................. H01J 40/14; H01J 5/02
(52) U.S. Cl. ....................................... 250/239; 257/686
(58) Field of Search ............................. 250/239, 208.1, 250/214.1; 257/678, 680, 685, 686, 713, 723, 777, 783, 434; 438/64, 109, 116

(56) References Cited

U.S. PATENT DOCUMENTS 6,521,881 B2 * 2/2003 Tu et al. ..................... 250/239
6,680,525 B1 * 1/2004 Hsieh et al. ................. 257/686

* cited by examiner

Primary Examiner—Thanh X. Luu
Assistant Examiner—Seung C. Sohn
(74) Attorney, Agent, or Firm—Bacon & Thomas PLLC

(57) ABSTRACT

An image capture device comprises a substrate having a first side, a second side, a cavity running through the substrate from the first side to the second side and a conductor pattern. An image sensor is provided on the first side of the substrate to cover the cavity. A first die is provided in the cavity of the substrate and is bonded to a bottom of the image sensor. A second die is stacked on the first die. An insulating layer is provided on the second side of the substrate to cover the first die and the second die, and a frame is provided on the first side of the substrate to receive the image sensor therein. The frame has a window in which lenses are mounted.

12 Claims, 2 Drawing Sheets

IMAGE CAPTURE DEVICE

BACKGROUND OF THE INVENTION

1. Field of the Invention

The present invention relates generally to a camera, and more particularly to an image capture device with a smaller size thereof.

2. Description of the Related Art

FIG. 1 shows a conventional digital image capture device 70, which has a substrate 72 on which an image sensor 74, a frame 76, lenses 78 and a plurality of electronic devices 80 are mounted. The image sensor 74 is received in the frame 76 and the lenses 78 are mounted in a window of the frame 76. The electronic devices 80 is bonded on the substrate 72, some of which are arranged in the frame 76 and the other of which are arranged out of the frame 76.

In the present market, the electronic products are made into shorter, thinner, and lighter. The conventional image capture device 70 is hard to be installed in a smaller electronic product, such as cellular phone. How to reduce the size of the image capture device to make it can be installed in any electronic product is the issue which the manufacturers want to fix.

SUMMARY OF THE INVENTION

The primary objective of the present invention is to provide an image capture device, which is smaller than the conventional device.

According to the objective of the present invention, an image capture device comprises a substrate having a first side, a second side and a conductor pattern. An image sensor is provided on the first side of the substrate and is electrically connected to the conductor pattern. A first die is provided on the second side of the substrate and is electrically connected to the conductor pattern. A second die is stacked on the first die and is electrically connected to the conductor pattern, and a frame is provided on the first side of the substrate to receive the image sensor therein. The frame has a window aligned with the image sensor.

DETAILED DESCRIPTION OF THE INVENTION

Figure 1:
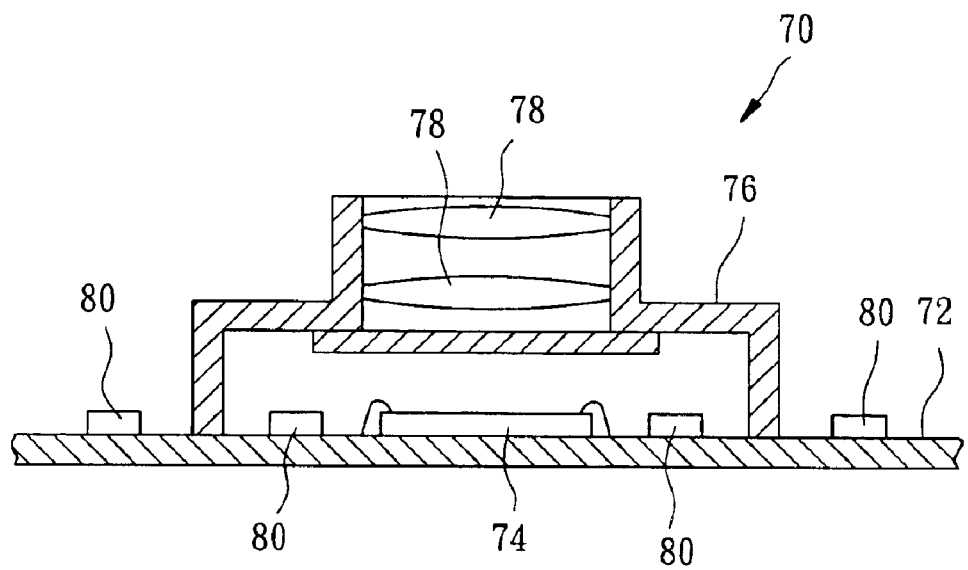
FIG. 1 is a sectional view of a conventional image capture device.
Figure 2:
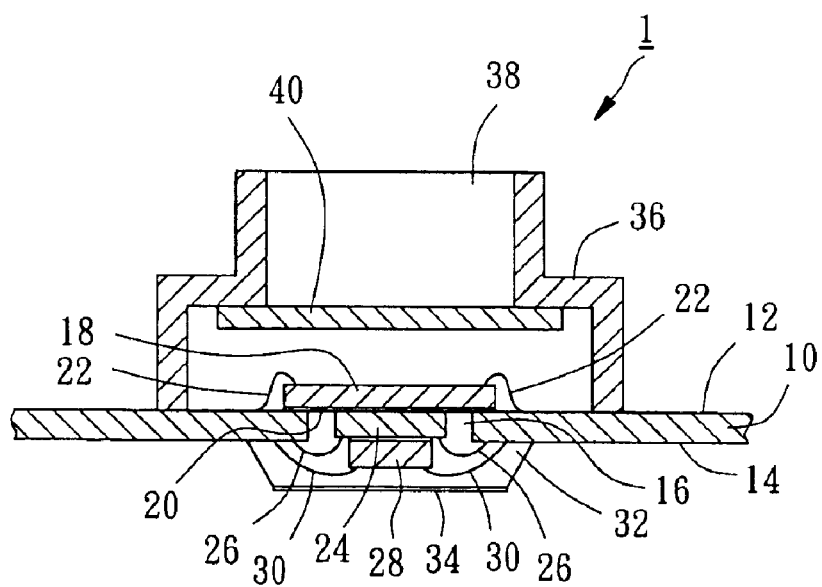
FIG. 2 is a sectional view of a first preferred embodiment of the present invention.

As shown in FIG. 2, an image capture device 1 of the first preferred embodiment of the present invention comprises:

A substrate 10 has a first side 12 and a second side 14. The substrate 10 has a conductor pattern (not shown) on both of the first and the second sides 12 and 14 and a cavity 16 running through the substrate 10 from the first side 12 to the second side 14.

An image sensor 18, which is a CMOS image sensor (CIS), is bonded on the first side 12 of the substrate 10 via an adhesive layer 20. The image sensor 18 is greater than the cavity 16 of the substrate 10 to cover an end of the cavity 16. The image sensor 18 is electrically connected to the conductor pattern on the first side 12 of the substrate 10 via gold wires 22.

A first die 24, which is smaller than the cavity 16, is received in the cavity 16 of the substrate 10 and is bonded to the adhesive layer 30 on a bottom of the image sensor 18. The first die 24 is electrically connected to the conductor pattern on the second side 14 of the substrate 10 via gold wires 26.

A second die 28 is stacked on the first die 24 and is electrically connected to the conductor pattern on the second side 14 of the substrate 10 via gold wires 30.

An insulating layer 32, which is epoxy resin or other insulating materials, is provided on the second side 14 of the substrate 10 to cover the first die 24, the second die 28, the gold wires 26 and 30 and cavity 16.

A heat sink 34, which is a metal plate in the present preferred embodiment of the present invention, is bonded on the insulating layer 32.

A frame 34 is mounted on the first side 12 of the substrate 10 to receive the image sensor 18 therein. The frame 36 has a window 38 aligned with the image sensor 18, on the bottom end of which a glass 40 is mounted. The glass 40 is to seal the window 38 of the frame to isolate water or dust running into the frame 34 via the window 38, which might affect the image sensor 18 working.

The character of the present invention is to have the electronic devices, such as image sensor, flash and digital signal processor etc. stacked on the substrate. The stacked electronic devices make the image capture device smaller in width. The stacked electronic devices further are arranged in a cavity of the substrate and that might make the image capture device shorter in height. In a result, the image capture device of the present invention has a smaller size to be installed in any electronic product easily.

Figure 3:
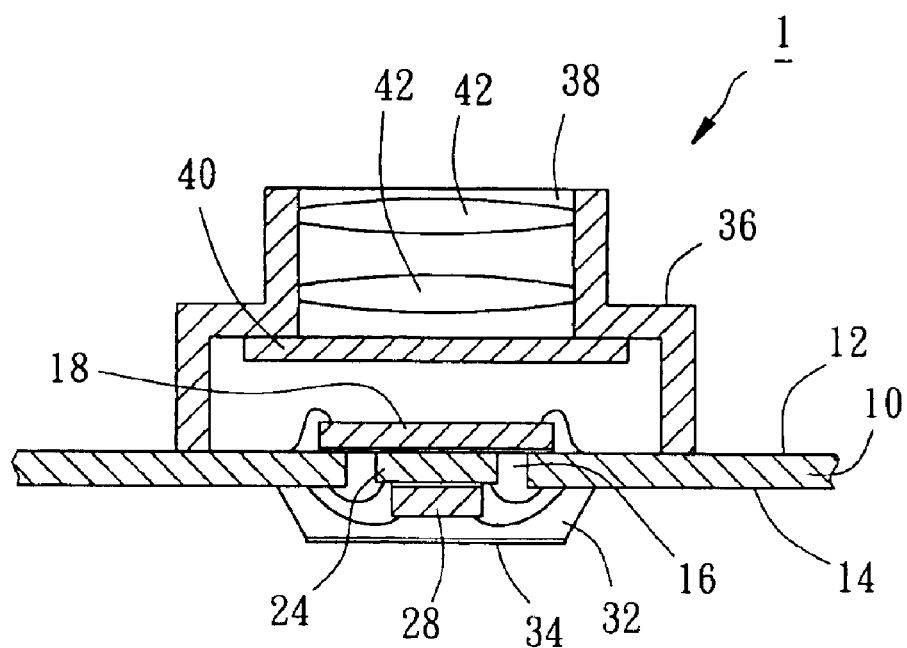
FIG. 3 is a sectional view of the first preferred embodiment of the present invention, showing the lenses mounted to the frame.

For some manufacturers he who has no capability of fabrication or assembly of lenses, they can fabricate the image capture device 1 as shown in FIG. 2 and send them to other manufacturer to install lenses 42 in the window 38 of the frame 36 as shown in FIG. 3. For some manufacturers he who is able to fabricate or assemble the lenses, they can install the lenses 42 on the frame 36 directly without the glass 40.

Figure 4:
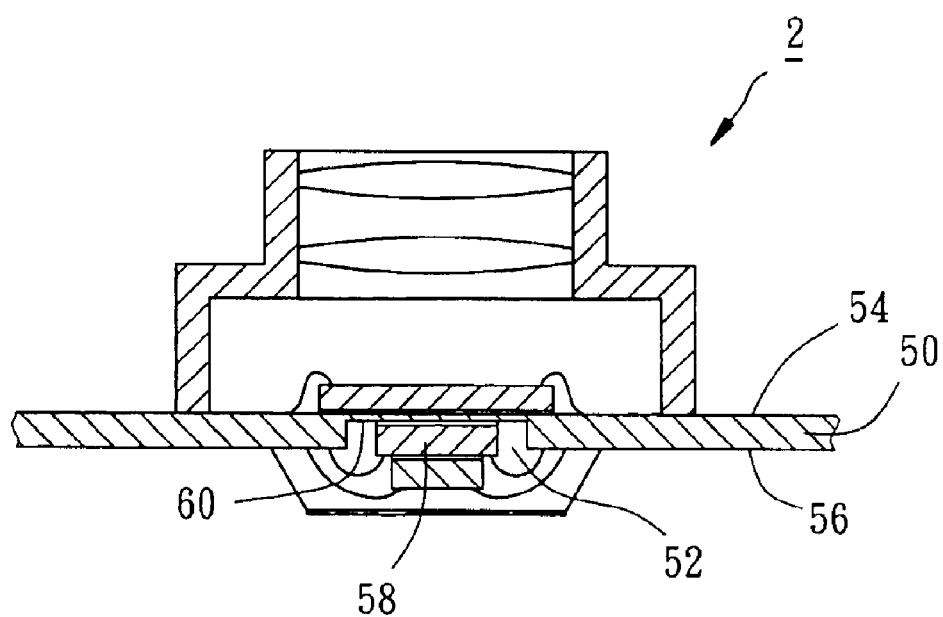
FIG. 4 is a sectional view of a second preferred embodiment of the present invention.

FIG. 4 shows an image capture device 2 of the second preferred embodiment of the present invention, which is similar to the image capture device 1 of the first preferred embodiment, except that a substrate 50 has a cavity 52, which is close at a first side 54 of the substrate 50 and is open at a second side 56 of the substrate 50. A first die 58 is bonded on a bottom 60 of the cavity 52 of the substrate 50.

The image sensor is sensitive to temperature, so that, in the first preferred embodiment, the adhesive layer 20 between the image sensor 18 and the first die 24 should have both functions of adhesion and heat isolation. Such adhesive layer can be made of epoxy resin, black glue or other suitable materials. There might be a further layer (not shown in FIGS.) provided in between the image sensor 18 and the first die 24 to enhance the functions of adhesion and heat isolation.

The first die can be a memory chip, such as a Random Access Memory (RAM) or a flash, and the second die can be a digital signal processor (DSP). The first die also can be a digital signal processor and the second die can be a memory chip. The first die and the second die are not restricted in the electronic devices mentioned in the specification.

What is claimed is:

1. An image capture device, comprising:
   a substrate having a first side, a second side and a conductor pattern;
   an image sensor provided on the first side of the substrate and electrically connected to the conductor pattern;
   a first die provided on the second side of the substrate and electrically connected to the conductor pattern;
   a second die stacked on the first die and electrically connected to the conductor pattern, and
   a frame provided on the first side of the substrate to receive the image sensor therein, wherein the frame has a window aligned with the image sensor.

2. The image capture device as defined in claim 1, further comprising an insulating layer provided on the second side of the substrate to cover the first die and the second die.

3. The image capture device as defined in claim 2, further comprising a heat sink provided to the insulating layer.

4. The image capture device as defined in claim 3, wherein the insulating layer is a metal plate.

5. The image capture device as defined in claim 1, further comprising a glass provided to the frame to seal the window.

6. The image capture device as defined in claim 1, further comprising at least a lens provided in the window of the frame.

7. The image capture device as defined in claim 5, further comprising at least a lens provided in the window of the frame.

8. The image capture device as defined in claim 1, wherein the first die is a memory chip and the second die is a digital signal processor.

9. The image capture device as defined in claim 1, wherein the first die is a digital signal processor and the second die is a memory chip.

10. The image capture device as defined in claim 1, wherein the substrate is provided with a cavity and the first die has at least a portion thereof received in the cavity.

11. The image capture device as defined in claim 10, wherein the cavity runs through the substrate from the first side to the second side and the image sensor has a portion aligned with the cavity and the first die is bonded on a bottom of the image sensor.

12. The image capture device as defined in claim 10, wherein the cavity is close at the first side of the substrate and is open at the second side of the substrate and the first die is bonded on a bottom of the cavity.

* * * * *